(12) United States Patent
Masuda et al.

(10) Patent No.: US 9,293,549 B2
(45) Date of Patent: Mar. 22, 2016

(54) SILICON CARBIDE SEMICONDUCTOR DEVICE AND METHOD FOR MANUFACTURING THE SAME

(71) Applicants: Sumitomo Electric Industries, Ltd., Osaka-shi (JP); NATIONAL UNIVERSITY CORPORATION NARA INSTITUTE OF SCIENCE AND TECHNOLOGY, Ikoma-shi (JP)

(72) Inventors: Takeyoshi Masuda, Osaka (JP); Tomoaki Hatayama, Ikoma (JP)

(73) Assignees: Sumitomo Electric Industries, Ltd., Osaka-shi (JP); National University Corporation Nara Institute of Science and Technology, Ikoma-shi (JP)

( * ) Notice: Subject to any disclaimer, the term of this patent is extended or adjusted under 35 U.S.C. 154(b) by 212 days.

(21) Appl. No.: 13/658,672

(22) Filed: Oct. 23, 2012

(65) Prior Publication Data

US 2013/0126904 A1    May 23, 2013

Related U.S. Application Data

(60) Provisional application No. 61/562,081, filed on Nov. 21, 2011.

(30) Foreign Application Priority Data

Nov. 21, 2011   (JP) .................................. 2011-253556

(51) Int. Cl.
*H01L 29/66* (2006.01)
*H01L 29/423* (2006.01)
(Continued)

(52) U.S. Cl.
CPC ........ *H01L 29/4236* (2013.01); *H01L 21/3065* (2013.01); *H01L 29/66068* (2013.01); *H01L 29/7813* (2013.01); *H01L 29/045* (2013.01); *H01L 29/1608* (2013.01)

(58) Field of Classification Search
CPC .................... H01L 29/4236; H01L 29/66068; H01L 29/7813
USPC .................................... 257/77, 314, 330, 622
See application file for complete search history.

(56) References Cited

U.S. PATENT DOCUMENTS 5,436,174 A    7/1995 Baliga et al.
6,660,591 B2 *  12/2003 Peake ............... H01L 29/66348
                                                       257/E21.384

(Continued)

FOREIGN PATENT DOCUMENTS

JP    H10154809 A    6/1998
JP    H1131815 A     2/1999

(Continued)

OTHER PUBLICATIONS

Notice of Grounds of Rejection in Japanese Patent Application No. 2011-253556, dated Jan. 6, 2015.

(Continued)

*Primary Examiner* — Jamie C Niesz
(74) *Attorney, Agent, or Firm* — Venable LLP; Michael A. Sartori; F. Brock Riggs (57) ABSTRACT

A silicon carbide layer includes a first region having a first conductivity type, a second region provided on the first region and having a second conductivity type, and a third region provided on the second region and having the first conductivity type. A trench having an inner surface is formed in the silicon carbide layer. The trench penetrates the second and third regions. The inner surface of the trench has a first side wall and a second side wall located deeper than the first side wall and having a portion made of the second region. Inclination of the first side wall is smaller than inclination of the second side wall.

2 Claims, 7 Drawing Sheets

(51) Int. Cl.
  *H01L 29/78* (2006.01)
  *H01L 21/3065* (2006.01)
  *H01L 29/04* (2006.01)
  *H01L 29/16* (2006.01)

(56) References Cited

U.S. PATENT DOCUMENTS

| | | | |
|---|---|---|---|
| 2001/0042885 | A1 | 11/2001 | Nakamura |
| 2006/0154438 | A1 | 7/2006 | Kishimoto et al. |
| 2007/0015333 | A1 | 1/2007 | Kishimoto et al. |
| 2007/0057262 | A1 | 3/2007 | Nakamura et al. |
| 2008/0230787 | A1* | 9/2008 | Suzuki ................ H01L 29/0623 257/77 |
| 2010/0006861 | A1 | 1/2010 | Yamamoto et al. |
| 2010/0193862 | A1 | 8/2010 | Kanazawa |
| 2012/0205670 | A1 | 8/2012 | Kudou et al. |
| 2013/0062629 | A1* | 3/2013 | Hiyoshi .............. H01L 21/3065 257/77 |
| 2013/0119407 | A1* | 5/2013 | Masuda ............ H01L 21/02107 257/77 |

FOREIGN PATENT DOCUMENTS

| | | |
|---|---|---|
| JP | 2000-068505 | 3/2000 |
| JP | 2002-141407 A | 5/2002 |
| JP | 2006-196523 A | 7/2006 |
| JP | 2007-165657 A | 6/2007 |
| JP | 2007-227649 A | 9/2007 |
| JP | 2007-258465 A | 10/2007 |
| JP | 2009-188221 | 8/2009 |
| JP | 2010-182857 A | 8/2010 |
| WO | WO-2011/048800 A1 | 4/2011 |

OTHER PUBLICATIONS

Notice of Grounds of Rejection in Japanese Patent Application No. 2011-253556, dated May 26, 2015.

Koketsu et al., "Control of Inclined Sidewall Angles of 4H-SiC Mesa and Trench Structures," Materials Science Forum, vol. 679-680, Mar. 28, 2011.

Extended European Search Report in European Patent Application No. 12851689.5, dated Jun. 17, 2015.

* cited by examiner

SILICON CARBIDE SEMICONDUCTOR DEVICE AND METHOD FOR MANUFACTURING THE SAME

BACKGROUND OF THE INVENTION

1. Field of the Invention

The present invention relates to a silicon carbide semiconductor device and a method for manufacturing the same, and more particularly to a silicon carbide semiconductor device having a silicon carbide layer with a trench formed therein and a method for manufacturing the same.

2. Description of the Background Art

Japanese Patent Laying-Open No. 2009-188221 discloses a MOSFET (Metal Oxide Semiconductor Field Effect Transistor) having a silicon carbide substrate with a trench formed therein. The publication also discloses that it is necessary to control an angle of a side wall of the trench to a specific angle in order to obtain a MOSFET having high channel mobility.

However, when the angle of the side wall of the trench is determined from the viewpoint of channel mobility, it has sometimes been difficult to perform the step of filling a gate electrode into the trench due to a high aspect ratio of the trench.

SUMMARY OF THE INVENTION

The present invention has been made to solve such a problem, and one object of the present invention is to provide a silicon carbide semiconductor device having both preferable channel characteristics and easiness of filling a gate electrode into a trench, and a method for manufacturing the same.

A silicon carbide semiconductor device in accordance with the present invention includes a silicon carbide layer, a gate insulating film, and a gate electrode. The silicon carbide layer has a thickness direction, and has a first main surface and a second main surface opposite to the first main surface in the thickness direction. The silicon carbide layer includes a first region forming the first main surface and having a first conductivity type, a second region provided on the first region and having a second conductivity type different from the first conductivity type, and a third region provided on the second region and having the first conductivity type. A trench having an inner surface is formed in the second main surface of the silicon carbide layer. The trench penetrates the second and third regions. The gate insulating film covers the inner surface of the trench. The gate electrode fills at least a portion of the trench. The inner surface of the trench has a first side wall and a second side wall located deeper than the first side wall and having a portion made of the second region. Inclination of the first side wall with respect to the second main surface is smaller than inclination of the second side wall with respect to the second main surface.

According to the silicon carbide semiconductor device described above, the inner surface of the trench includes the second side wall having the portion made of the second region that can serve as a channel. The inclination of the second side wall with respect to the second main surface of the silicon carbide layer can be selected to obtain preferable channel characteristics. Since the first side wall located shallower than the second side wall has a smaller inclination and thus a shallow portion of the trench is opened more widely, the gate electrode can fill the trench more easily.

Preferably, the second side wall connects a boundary between the first and second regions with a boundary between the second and third regions.

Thereby, the channel connecting between the first and second regions is provided using a portion made of the second side wall having a preferable inclination in terms of channel characteristics. Since the channel is entirely made of a side wall having a preferable inclination, more preferable channel characteristics can be achieved.

More preferably, the gate electrode fills the trench until the gate electrode reaches at least between the first and second side walls.

Thereby, the gate electrode fills the trench to face the entire second side wall in a depth direction. Thus, the gate electrode sufficiently fills the trench to be able to control the entire channel provided using the portion made of the second side wall.

A method for manufacturing a silicon carbide semiconductor device in accordance with the present invention includes the steps of: preparing a silicon carbide layer having a thickness direction, and having a first main surface and a second main surface opposite to the first main surface in the thickness direction, the silicon carbide layer including a first region forming the first main surface and having a first conductivity type, a second region provided on the first region and having a second conductivity type different from the first conductivity type, and a third region provided on the second region and having the first conductivity type; forming a mask having an opening on the second main surface of the silicon carbide layer; forming a trench in the second main surface of the silicon carbide layer by etching the silicon carbide layer using the mask, the trench having an inner surface and penetrating the second and third regions, the step of forming the trench being performed such that the inner surface of the trench has a first side wall and a second side wall located deeper than the first side wall and having a portion made of the second region, and such that inclination of the first side wall with respect to the second main surface is smaller than inclination of the second side wall with respect to the second main surface; forming a gate insulating film covering the inner surface of the trench; and forming a gate electrode filling at least a portion of the trench.

According to the manufacturing method described above, the inner surface of the trench includes the second side wall having the portion made of the second region that can serve as a channel. The inclination of the second side wall with respect to the second main surface of the silicon carbide layer can be selected to obtain preferable channel characteristics. Since the first side wall located shallower than the second side wall has a smaller inclination and thus a shallow portion of the trench is opened more widely, the gate electrode can fill the trench more easily.

In the manufacturing method described above, the step of forming the trench may include the steps of: forming a concave portion in the second main surface of the silicon carbide layer by physically etching the silicon carbide layer; and performing thermal etching on an inner surface of the concave portion.

Thereby, the trench can be formed such that the inclination of the first side wall with respect to the second main surface is smaller than the inclination of the second side wall with respect to the second main surface.

Preferably, the step of forming the concave portion is performed such that the concave portion is located shallower than the second region.

This can avoid the first side wall from being formed too deeply. Thus, a larger portion of the channel can be made of the second side wall having a preferable inclination in terms of channel characteristics.

More preferably, the step of forming the concave portion is performed such that the inner surface of the concave portion includes a first side surface and a second side surface located deeper than the first side surface and inclined with respect to the first side surface.

Thereby, each of the first and second side surfaces formed by the physical etching is eroded by the thermal etching, and thus the first and second side walls can be formed more reliably.

The manufacturing method described above may further include the step of forming an altered layer in the silicon carbide layer by implanting ions into the silicon carbide layer using the mask, before the step of forming the trench. In this case, the step of forming the trench can include the step of removing a region of the silicon carbide layer including the altered layer by thermal etching.

Thereby, the etching rate in the thermal etching can be increased at the altered layer formed in the silicon carbide layer. Thus, in the first half of the thermal etching, etching of the altered layer is mainly performed at a relatively high rate, and in the second half of the thermal etching, etching of the normal silicon carbide layer is performed at a relatively low rate. Through such a two-stage process, the first and second side walls having different degrees of inclination are formed more reliably.

Preferably, the step of forming the altered layer is performed such that the altered layer is located shallower than the second region.

Thereby, the second side wall is formed up to a shallower position, and thus the second side wall can also be formed at a portion of the second region located at a shallow position. Accordingly, since a larger portion of the channel made of the second region can be formed of a side wall having a preferable inclination, more preferable channel characteristics can be achieved.

Preferably, the step of forming the altered layer is performed at normal temperature.

Since the ion implantation is thereby performed at normal temperature, the degree of crystal defects caused during the ion implantation is increased when compared with a case where the ion implantation is performed at high temperature. As a result, the etching rate in the thermal etching on the altered layer is more increased, resulting in a larger difference in etching rate between the altered layer and a portion other than that in the silicon carbide layer. Consequently, the first and second side walls having different degrees of inclination are formed more reliably.

In the manufacturing method described above, the step of preparing the silicon carbide layer may be performed such that crystallinity of the third region is lower than crystallinity of the second region.

Thereby, in the thermal etching, the etching rate of the third region is higher than the etching rate of the second region. Consequently, the first and second side walls having different degrees of inclination are formed more reliably.

As described above, according to the present invention, both preferable channel characteristics and easiness of filling a gate electrode into a trench can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The following describes embodiments of the present invention with reference to the drawings. It should be noted that in the below-mentioned drawings, the same or corresponding portions are given the same reference characters and are not described repeatedly. Further, in the crystallographic description in the present specification, an individual orientation is represented by [ ], a group orientation is represented by < >, an individual plane is represented by ( ) and a group plane is represented by { }. In addition, a negative index is supposed to be crystallographically indicated by putting "-" (bar) above a numeral, but is indicated by putting the negative sign before the numeral in the present specification.

(Embodiment 1)

Figure 1:
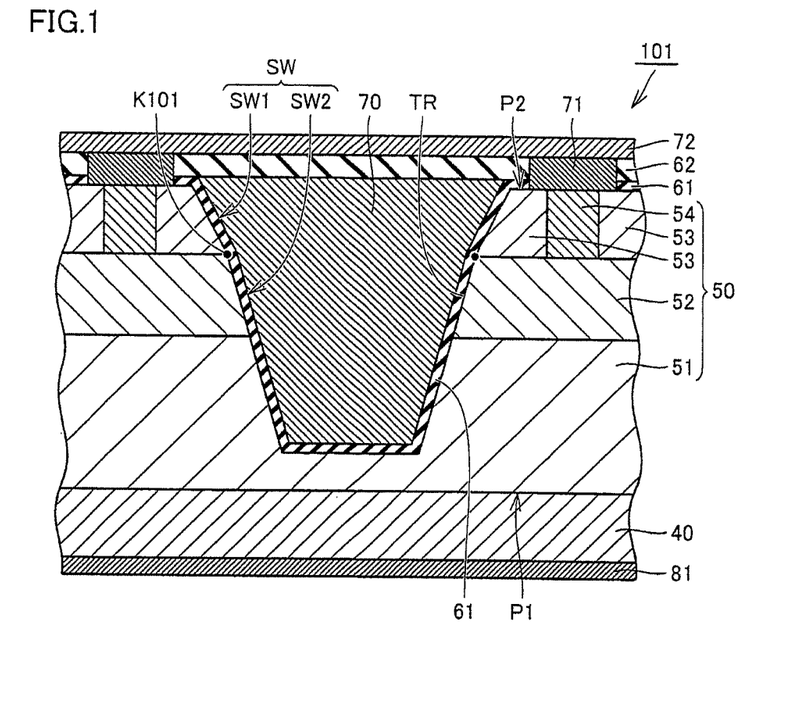
FIG. 1 is a cross sectional view schematically showing a structure of a silicon carbide semiconductor device in accordance with Embodiment 1 of the present invention.

As shown in FIG. 1, a MOSFET (Metal Oxide Semiconductor Field Effect Transistor) 101 as a silicon carbide semiconductor device in accordance with the present embodiment has a substrate 40, an epitaxial layer (silicon carbide layer) 50, a gate insulating film 61, an interlayer insulating film 62, a gate electrode 70, a source electrode 71, a source wire electrode 72, and a drain electrode 81.

Substrate 40 is made of an n type (first conductivity type) semiconductor or conductor, and is preferably a single crystal silicon carbide substrate. Drain electrode 81 is provided on one side of substrate 40, and epitaxial layer 50 is provided on the other side of substrate 40. Drain electrode 81 is an ohmic electrode.

Epitaxial layer 50 has a thickness direction (vertical direction in the drawing), and has a lower surface (first main surface) P1 facing substrate 40 and an upper surface (second main surface) P2 opposite to lower surface P1 in the thickness direction. When epitaxial layer 50 has a hexagonal crystal structure, upper surface P2 has a plane orientation of preferably substantially a {000-1} plane and more preferably substantially a (000-1) plane. When epitaxial layer 50 has a cubic crystal structure, upper surface P2 has a plane orientation of preferably substantially a {111} plane. Epitaxial layer 50 has first to third regions 51 to 53 and a contact region 54. First region 51 forms lower surface P1 and has n type. Second region 52 is provided on first region 51 and has a conductivity type different from n type, that is, p type (second conductivity type). Third region 53 is provided on second region 52 and has n type. Contact region 54 has p type and connects second region 52 with source electrode 71.

A trench TR having an inner surface is formed in upper surface P2 of epitaxial layer 50. Trench TR penetrates second and third regions 52, 53. The inner surface of trench TR has side walls SW. Each side wall SW has an upper side wall (first side wall) SW1 and a lower side wall SW2 (second side wall) located deeper than upper side wall SW1 and having a portion made of second region 52. Inclination of upper side wall SW1 with respect to upper surface P2 is smaller than inclination of lower, side wall SW2 with respect to upper surface P2. When epitaxial layer 50 has a hexagonal crystal structure, the crystal plane of lower side wall SW2 preferably corresponds to substantially a {0-33-8} plane or a {01-1-4} plane. When epitaxial layer 50 has a cubic crystal structure, the crystal plane of lower side wall SW2 preferably corresponds to substantially a {100} plane. Lower side wall SW2 connects a boundary between first and second regions 51, 52 with a boundary between second and third regions 52, 53. A bending point K101 between upper side wall SW1 and lower side wall SW2 on the inner surface of trench TR is located at the boundary between second and third regions 52, 53.

Gate insulating film 61 covers the inner surface of trench TR. Gate electrode 70 fills at least a portion of trench TR. Further, in the present embodiment, gate electrode 70 fills trench TR until gate electrode 70 reaches at least between upper side wall SW1 and lower side wall SW2. Specifically, gate electrode 70 fills trench TR until gate electrode 70 reaches at least bending point K101, and in the present embodiment, gate electrode 70 fills trench TR to exceed bending point K101.

Source electrode 71 is an ohmic electrode arranged to make contact with each of third region 53 and contact region 54. Source wire electrode 72 is arranged on source electrode 71. Source wire electrode 72 is electrically insulated from gate electrode 70 by interlayer insulating film 62.

Next, a method for manufacturing MOSFET 101 (FIG. 1) will be described.

Figure 2:
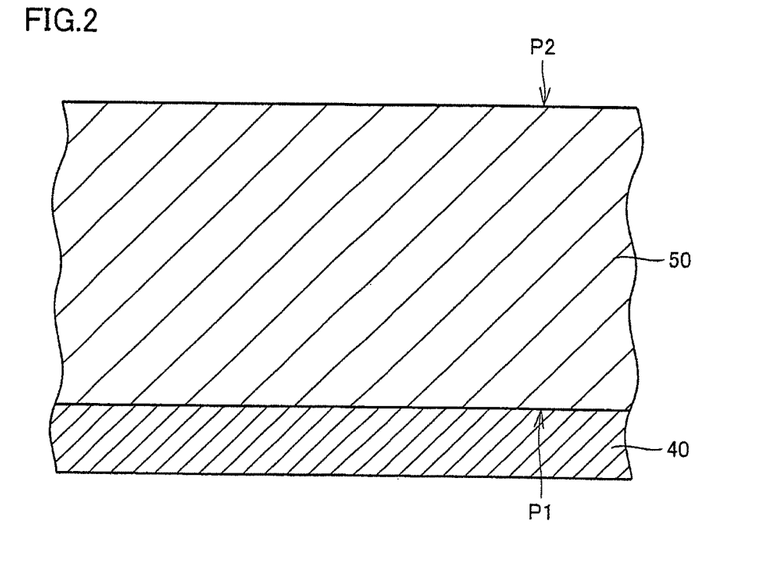
FIG. 2 is a cross sectional view schematically showing a first step of a method for manufacturing the silicon carbide semiconductor device in accordance with Embodiment 1 of the present invention.

As shown in FIG. 2, n type epitaxial layer 50 is formed on substrate 40. Epitaxial growth therefor can be performed by a CVD method that utilizes a mixed gas of silane ($SiH_4$) and propane ($C_3H_8$) as a material gas and utilizes hydrogen gas ($H_2$) as a carrier gas, for example. During the epitaxial growth, it is preferable to introduce nitrogen (N) or phosphorus (P) as a conductivity type impurity for imparting n type, for example. Epitaxial layer 50 contains the n type impurity at a concentration of, for example, not less than $5 \times 10^{15}$ cm$^{-3}$ and not more than $5 \times 10^{16}$ cm$^{-3}$.

Figure 3:
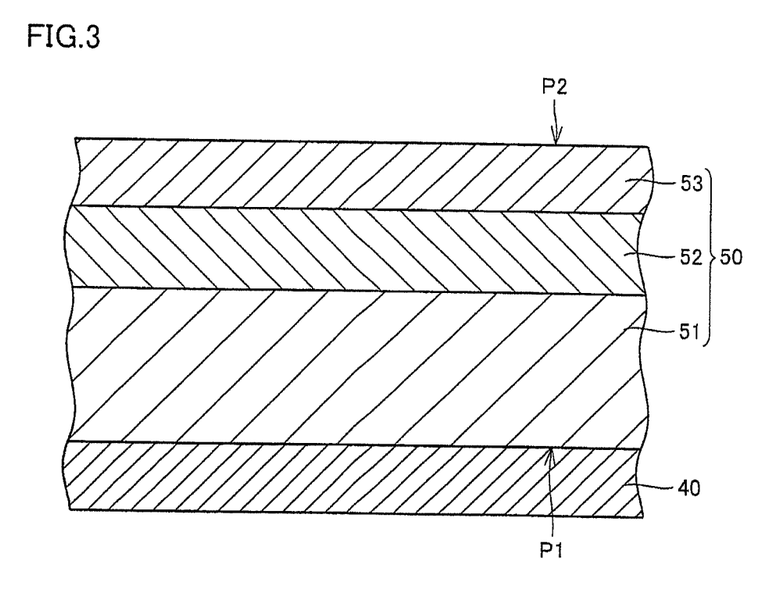
FIG. 3 is a cross sectional view schematically showing a second step of the method for manufacturing the silicon carbide semiconductor device in accordance with Embodiment 1 of the present invention.

As shown in FIG. 3, first to third regions 51 to 53 are formed in epitaxial layer 50 by implanting impurity ions into epitaxial layer 50. In the ion implantation for forming second region 52, for example, aluminum (Al) is used. In the ion implantation for forming third region 53, for example, phosphorus (P) is used. By adjusting acceleration energy of the ions, the depth of the region in which each of second and third regions 52, 53 is to be formed is adjusted.

Figure 4:
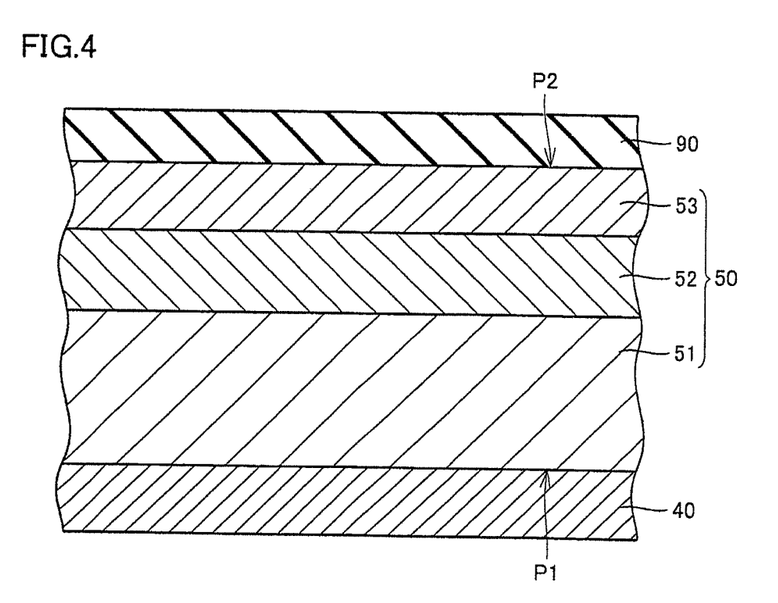
FIG. 4 is a cross sectional view schematically showing a third step of the method for manufacturing the silicon carbide semiconductor device in accordance with Embodiment 1 of the present invention.

As shown in FIG. 4, a mask 90 is formed on upper surface P2 of epitaxial layer 50. Preferably, mask 90 is formed by a deposition method. The deposition method used herein is a method characterized in that all materials for a film to be formed are externally supplied. Thus, the deposition method does not include a thermal oxidation method, that is, a method utilizing an element already existing in a region where a film is to be formed, as a part of materials. As the deposition method, for example, a CVD (Chemical Vapor Deposition) method, a sputtering method, or a resistance heating evaporation method can be used.

Figure 5:
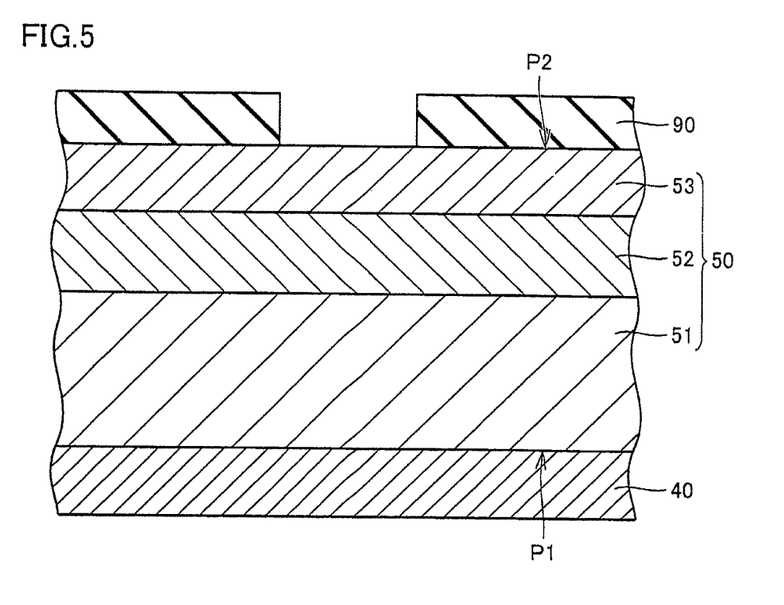
FIG. 5 is a cross sectional view schematically showing a fourth step of the method for manufacturing the silicon carbide semiconductor device in accordance with Embodiment 1 of the present invention.

As shown in FIG. 5, an opening is formed in mask 90. The opening can be formed, for example, using photolithography and etching. The opening has a width of, for example, not less than 0.1 μm and not more than 2 μm. Subsequently, by etching epitaxial layer 50 using mask 90, trench TR (FIG. 1) having the inner surface and penetrating second and third regions 52, 53 is formed in upper surface P2 of epitaxial layer 50. The step of forming trench TR is performed such that the inner surface of trench TR has upper side wall SW1 and lower side wall SW2 located deeper than upper side wall SW1 and having the portion made of second region 52, and such that the inclination of upper side wall SW1 with respect to upper surface P2 is smaller than the inclination of lower side wall SW2 with respect to upper surface P2. Hereinafter, this etching step will be described.

Figure 6:
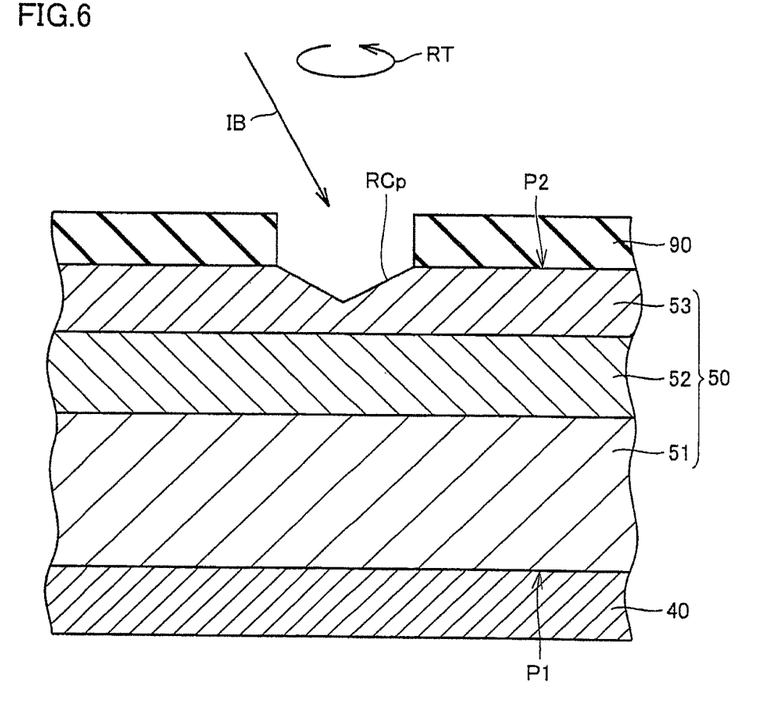
FIG. 6 is a cross sectional view schematically showing a fifth step of the method for manufacturing the silicon carbide semiconductor device in accordance with Embodiment 1 of the present invention.
Figure 7:
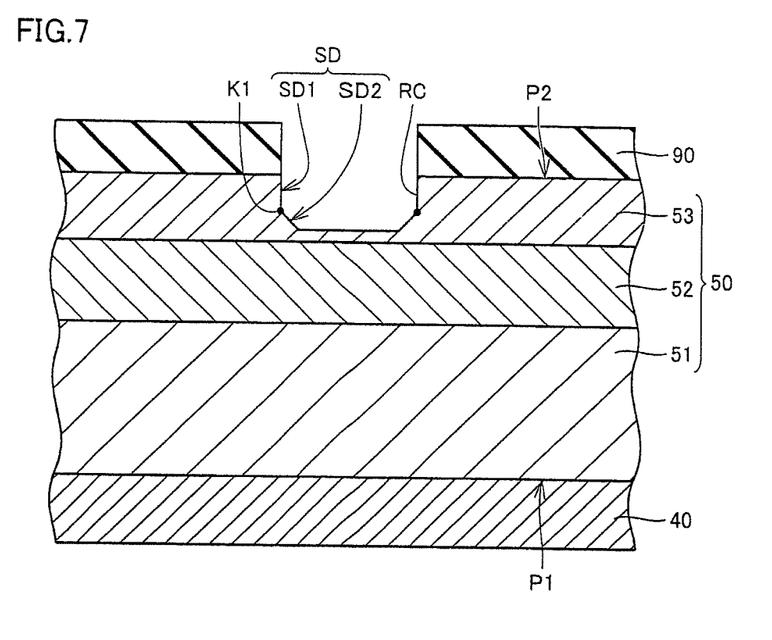
FIG. 7 is a cross sectional view schematically showing a sixth step of the method for manufacturing the silicon carbide semiconductor device in accordance with Embodiment 1 of the present invention.

As shown in FIGS. 6 and 7, by physically etching epitaxial layer 50, a concave portion RC is formed in upper surface P2 of epitaxial layer 50. In the present embodiment, concave portion RC is formed to be located shallower than second region 52 as shown in FIG. 7. Further, concave portion RC is formed such that its side surface SD includes an upper side surface (first side surface) SD1 and a lower side surface (second side surface) SD2 located deeper than upper side surface SD1 and inclined with respect to upper side surface SD1. Thereby, a bending point K1 is provided between upper side surface SD1 and lower side surface SD2.

Specifically, firstly, ion beam etching using an ion beam IB having an incident angle inclined with respect to upper surface P2 is performed, with upper surface P2 being in-plane rotated as indicated by an arrow RT (FIG. 6). By the ion beam etching, a concave portion RCp is formed in upper surface P2. Concave portion RCp has an inner surface inclined with respect to upper surface P2. Subsequently, ion beam etching or RIE (Reactive Ion Etching) using ion beam IB having an incident angle closer to perpendicular to upper surface P2 is performed, and thereby a concave portion (RC) is formed in upper surface P2 of epitaxial layer 50 as shown in FIG. 7. As the RIE, for example, ICP-RIE (Induction Coupled Plasma-RIB) which employs $SF_6$ or a mixed gas of $SF_6$ and $O_2$ as a reactive gas can be used.

Next, thermal etching is performed on an inner surface of concave portion RC. Specifically, treatment of heating the silicon carbide layer while exposing the silicon carbide layer to a process gas containing a reactive gas is performed. As the reactive gas, a chlorine-based gas can be used, and for example chlorine gas can be used. Further, a gas containing oxygen atoms may be mixed into the process gas, and for example oxygen gas may be mixed therein. Furthermore, the process gas may contain a carrier gas such as nitrogen gas, argon gas, helium gas, or the like. Heat treatment temperature in the thermal etching is preferably set to not less than 700° C. and not more than 1200° C. By setting the heat treatment temperature to not less than 700° C., an etching rate of SiC of about 70 μm/hr can be ensured. The lower limit temperature is more preferably set to not less than 800° C., and further preferably set to not less than 900° C. The upper limit temperature is more preferably set to not more than 1100° C., and further preferably set to not more than 1000° C. In addition, if silicon oxide, silicon nitride, aluminum oxide, aluminum nitride, or gallium nitride is used as a material for mask 90 on this occasion, etching selectivity of SiC with respect to the material for mask 90 can be extremely increased, and thus consumption of mask 90 during etching of SiC can be suppressed.

Figure 8:
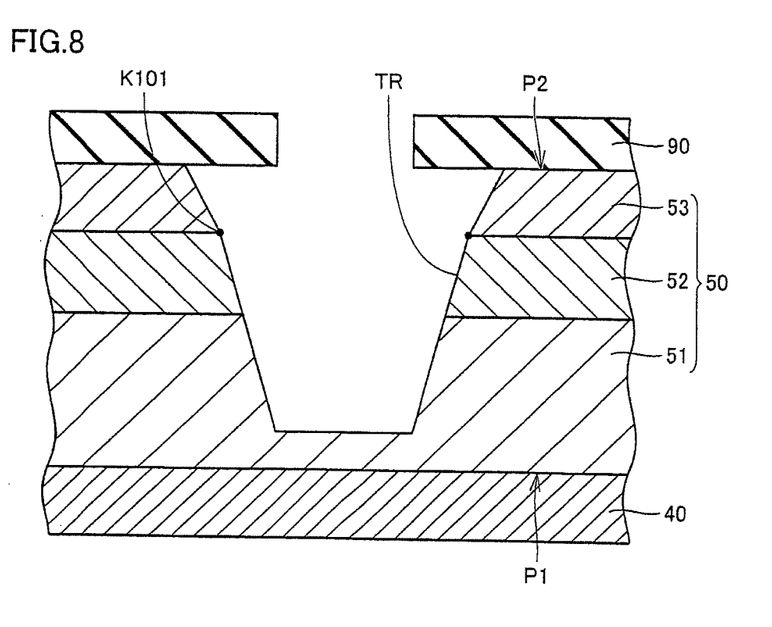
FIG. 8 is a cross sectional view schematically showing a seventh step of the method for manufacturing the silicon carbide semiconductor device in accordance with Embodiment 1 of the present invention.

As shown in FIG. 8, trench TR is formed by the above thermal etching. As the thermal etching proceeds, bending point K1 (FIG. 7) gradually moves to bending point K101. Next, mask 90 is removed for example by etching.

Referring again to FIG. 1, contact region 54 is formed by selectively implanting ions into a portion of upper surface P2. Then, annealing is performed to activate the impurity ions in epitaxial layer 50. Subsequently, gate insulating film 61 covering the inner surface of trench TR in epitaxial layer 50 and upper surface P2 is formed. Gate insulating film 61 is preferably a silicon oxide film. The silicon oxide film can be formed, for example, by thermally oxidizing epitaxial layer 50.

Next, gate electrode 70 filling at least a portion of trench TR is formed. This formation can be performed, for example, by depositing a material to serve as gate electrode 70 and thereafter performing CMP (Chemical Mechanical Polishing). Subsequently, interlayer insulating film 62, source electrode 71, and source wire electrode 72 are formed. Thereby, MOSFET 101 shown in FIG. 1 is obtained.

According to the present embodiment, the inner surface of trench TR includes lower side wall SW2 having the portion made of second region 52 that can serve as a channel in MOSFET 101. The inclination of lower side wall SW2 with respect to upper surface P2 of epitaxial layer 50 can be selected to obtain preferable channel characteristics. On the other hand, since upper side wall SW1 located shallower than lower side wall SW2 has a smaller inclination and thus a shallow portion of trench TR is opened more widely, gate electrode 70 can fill trench TR more easily.

Lower side wall SW2 connects the boundary between first and second regions 51, 52 with the boundary between second and third regions 52, 53. Thereby, the channel connecting between first and second regions 51, 52 is provided using a portion made of lower side wall SW2 having a preferable inclination in terms of channel characteristics. Since the channel is entirely made of a side wall having a preferable inclination, more preferable channel characteristics can be achieved.

Gate electrode 70 fills trench TR until gate electrode 70 reaches at least between upper side wall SW1 and lower side wall SW2. Thereby, gate electrode 70 fills trench TR to face entire lower side wall SW2 in a depth direction. Thus, gate electrode 70 sufficiently fills trench TR to be able to control the entire channel provided using the portion made of lower side wall SW2.

Concave portion RC is formed in upper surface P2 of epitaxial layer 50 by physically etching epitaxial layer 50. Thermal etching is performed on the inner surface of concave portion RC. Thereby, trench TR can be formed more reliably such that the inclination of upper side wall SW1 with respect to upper surface P2 is smaller than the inclination of lower side wall SW2 with respect to upper surface P2.

The concave portion is formed such that the concave portion is located shallower than second region 52. This can avoid upper side wall SW1 from being formed too deeply. Thus, a larger portion of the channel can be made of lower side wall SW2 having a preferable inclination in terms of channel characteristics.

The step of forming concave portion RC is performed such that the inner surface of the concave portion includes upper side surface SD1 and lower side surface SD2 located deeper than upper side surface SD1 and inclined with respect to upper side surface SD1. Thereby, each of upper side surface SD1 and lower side surface SD2 formed by the physical etching is eroded by the thermal etching, and thus upper side wall SW1 and lower side wall SW2 can be formed more reliably.

Next, two variations of MOSFET 101 will be described.

Figure 9:
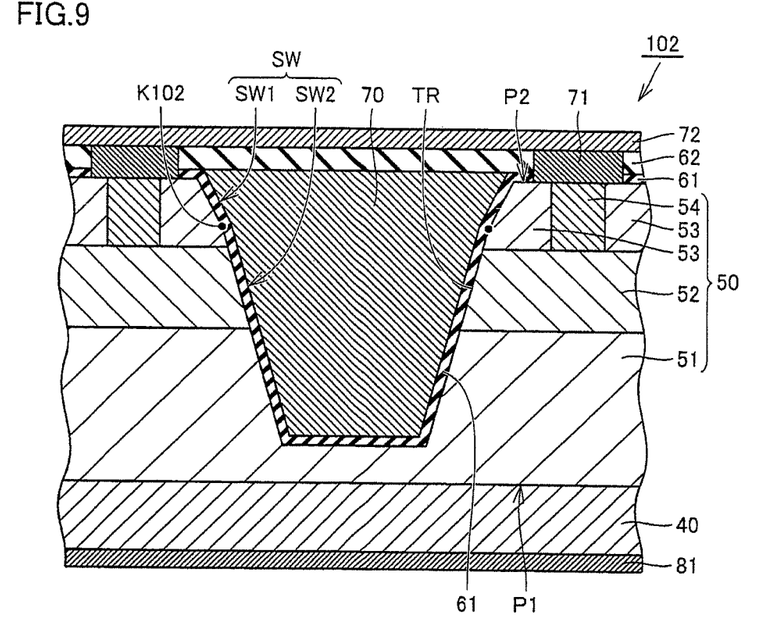
FIG. 9 is a cross sectional view schematically showing a first variation of the structure of the silicon carbide semiconductor device in FIG. 1.

As shown in FIG. 9, in a MOSFET 102, a bending point K102 between upper side wall SW1 and lower side wall SW2 on the inner surface of trench TR is apart from the boundary between second and third regions 52, 53 and located in third region 53. According to this variation, even if the position of bending point K102 varies due to variations in the steps, lower side wall SW2 can more reliably connect the boundary between first and second regions 51, 52 with the boundary between second and third regions 52, 53.

Figure 10:
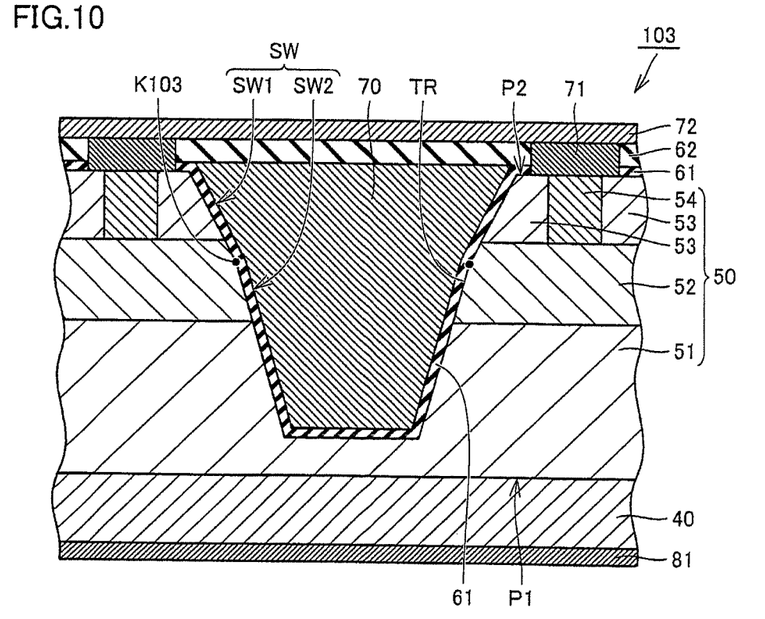
FIG. 10 is a cross sectional view schematically showing a second variation of the structure of the silicon carbide semiconductor device in FIG. 1.

As shown in FIG. 10, in a MOSFET 103, a bending point K103 between upper side wall SW1 and lower side wall SW2 on the inner surface of trench TR is apart from the boundary between second and third regions 52, 53 and located in second region 52. According to this variation, since the shallow portion of trench TR is opened more widely, gate electrode 70 can fill trench TR more easily.

(Embodiment 2)

Figure 11:
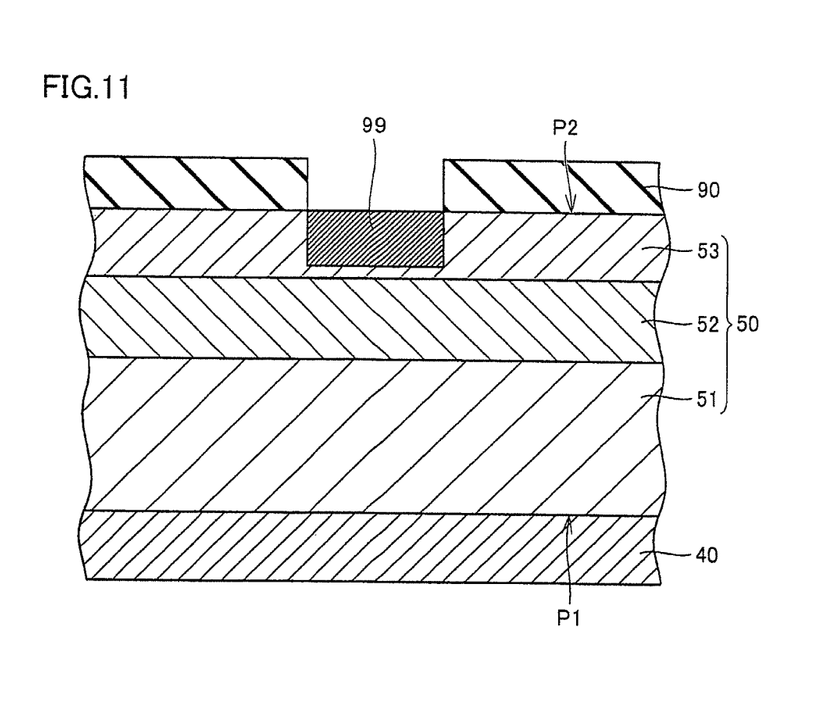
FIG. 11 is a cross sectional view schematically showing a first step of a method for manufacturing a silicon carbide semiconductor device in accordance with Embodiment 2 of the present invention.
Figure 12:
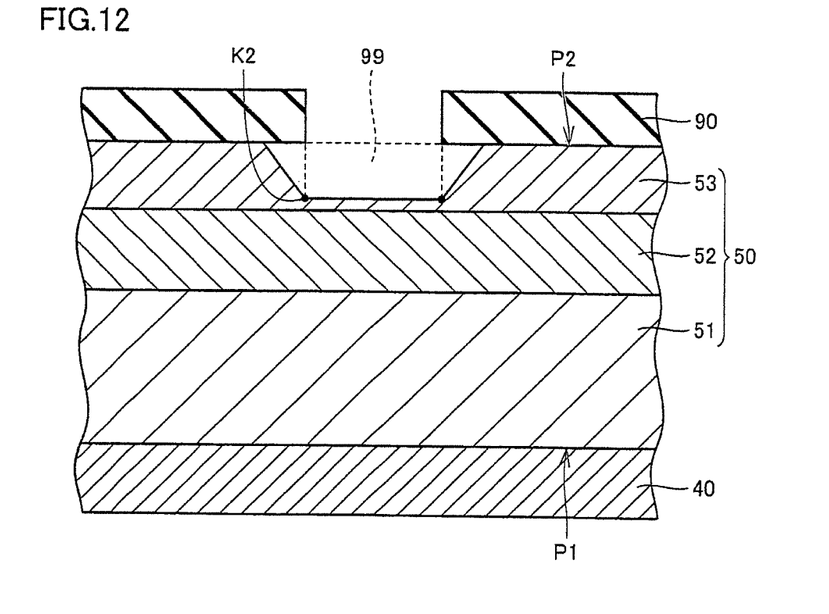
FIG. 12 is a cross sectional view schematically showing a second step of the method for manufacturing the silicon carbide semiconductor device in accordance with Embodiment 2 of the present invention.

In the present embodiment, firstly, the steps identical to those in up to FIG. 5 in Embodiment 1 are performed. Next, as shown in FIG. 11, an altered layer 99 is formed in epitaxial layer 50 by implanting ions into epitaxial layer 50 using mask 90. Preferably, the step of forming altered layer 99 is performed such that altered layer 99 is located shallower than second region 52. Preferably, the step of forming altered layer 99 is performed at normal temperature. Subsequently, thermal etching identical to that in Embodiment 1 is performed. In this case, in the first half of the thermal etching, a region of epitaxial layer 50 including altered layer 99 is removed as shown in FIG. 12. A concave portion thereby formed has a bending point K2. Since the steps other than that are substantially identical to those in Embodiment 1, the description thereof will not be repeated.

According to the present embodiment, altered layer 99 is formed in epitaxial layer 50 by implanting ions into epitaxial layer 50 using mask 90, before the step of forming trench TR. As a result, the step of forming trench TR includes the step of removing the region of epitaxial layer 50 including altered layer 99 by thermal etching. Thereby, the etching rate in the thermal etching can be increased at altered layer 99 formed in epitaxial layer 50. Thus, in the first half of the thermal etching, etching of altered layer 99 is mainly performed at a relatively high rate, forming bending point K2 (FIG. 12). In the second half of the thermal etching, etching of normal epitaxial layer 50 is performed at a relatively low rate, and, as the thermal etching proceeds, bending point K2 (FIG. 12) gradually moves to any of bending points K101 to K103 (FIGS. 1, 9, 10). Thereby, upper side wall SW1 and lower side wall SW2 are formed more reliably.

Which of bending points K101 to K103 is obtained can be adjusted by the thickness of altered layer 99. To obtain bending point K101 or K102, the thickness of altered layer 99 is set to be smaller than the thickness of third region 53 as shown in FIG. 11. In other words, the step of forming altered layer 99 is performed such that altered layer 99 is located shallower than second region 52. Thereby, lower side wall SW2 is formed up to a shallower position, and thus lower side wall SW2 can also be formed at a portion of second region 52 located at a shallow position. Accordingly, since a larger portion of the channel made of second region 52 can be formed of a side wall having a preferable inclination, more preferable channel characteristics can be achieved.

If the ion implantation for forming altered layer 99 is performed at normal temperature, the degree of crystal defects caused during the ion implantation is increased more than that at high temperature. As a result, the etching rate in the thermal etching on altered layer 99 is more increased, resulting in a larger difference in etching rate between altered layer 99 and a portion other than that in epitaxial layer 50. Consequently, upper side wall SW1 and lower side wall SW2 having different degrees of inclination are formed more reliably.

(Embodiment 3)

Figure 13:
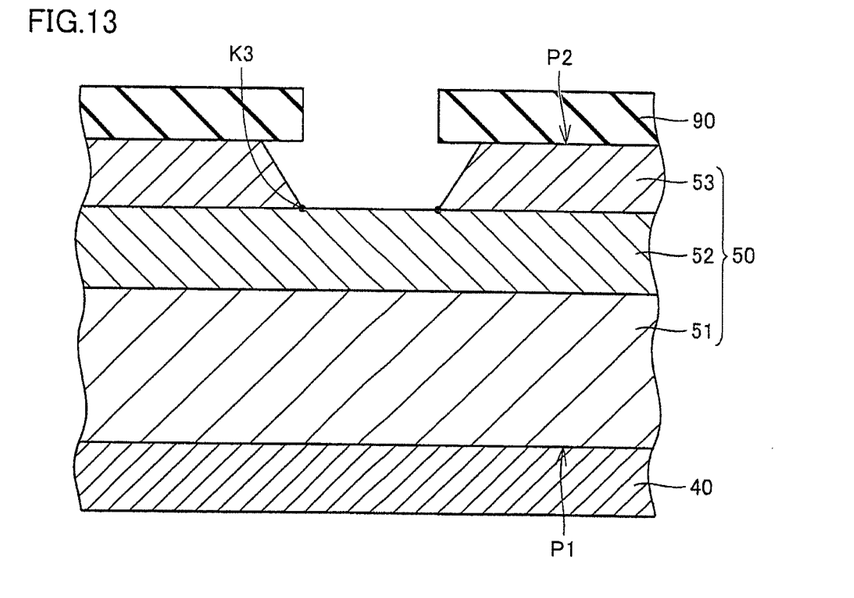
FIG. 13 is a cross sectional view schematically showing a first step of a method for manufacturing a silicon carbide semiconductor device in accordance with Embodiment 3 of the present invention.
Figure 14:
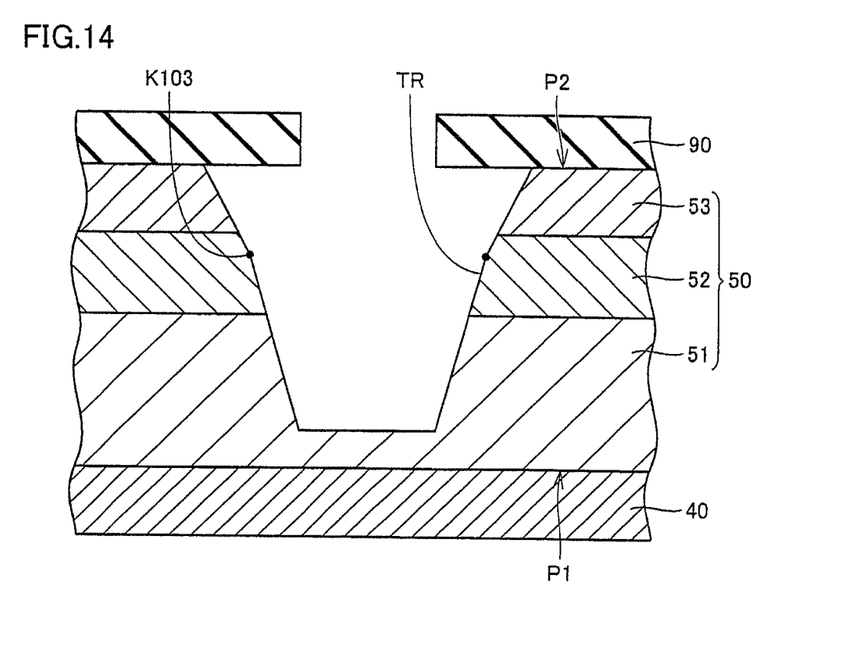
FIG. 14 is a cross sectional view schematically showing a second step of the method for manufacturing the silicon carbide semiconductor device in accordance with Embodiment 3 of the present invention.

In the present embodiment, in the ion implantation for forming third region 53 (FIG. 3) in Embodiment 1, a method which is particularly likely to cause crystal defects is selected. For example, the ion implantation for forming third region 53 is performed at normal temperature. As a result, crystallinity of third region 53 is sufficiently lower than crystallinity of second region 52. Thereafter, the steps identical to those in up to FIG. 5 in Embodiment 1 are performed. Next, thermal etching identical to that in Embodiment 1 is performed. In this case, in the first half of the thermal etching, third region 53 of epitaxial layer 50 is removed as shown in FIG. 13. A concave portion thereby formed has a bending point K3. Then, through the second half of the thermal etching, trench TR is formed, for example, as shown in FIG. 14. Since the steps other than that are substantially identical to those in Embodiment 1, the description thereof will not be repeated.

According to the present embodiment, the step of preparing epitaxial layer 50 is performed such that the crystallinity of third region 53 is sufficiently lower than the crystallinity of second region 52. Thereby, in the thermal etching, the etching rate of third region 53 is higher than the etching rate of second region 52. Thus, in the first half of the thermal etching, etching of third region 53 is performed at a relatively high rate, forming bending point K3 (FIG. 13). In the second half of the thermal etching, etching of second region 52 and first region 51 of epitaxial layer 50 is performed at a relatively low rate, and, as the thermal etching proceeds, bending point K3 (FIG. 13) gradually moves to any of bending points K101 to K103 (FIGS. 1, 9, 10). Thereby, upper side wall SW1 and lower side wall SW2 are formed. Thereby, upper side wall SW1 and lower side wall SW2 are formed more reliably.

Although a MOSFET has been particularly described in each of the above embodiments, the silicon carbide semiconductor device may be a MISFET (Metal Insulator Semiconductor Field Effect Transistor) other than a MOSFET. Further, the silicon carbide semiconductor device may be other than a MISFET, and may be, for example, an IGBT (Insulated Gate Bipolar Transistor).

In addition, a configuration in which n type and p type are reversed in each of the above embodiments may be used.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device, comprising:
a silicon carbide layer having a thickness direction, and having a first main surface and a second main surface opposite to said first main surface in said thickness direction, said silicon carbide layer including a first region forming said first main surface and having a first conductivity type, a second region provided on said first region and having a second conductivity type different from said first conductivity type, and a third region provided on said second region and having said first conductivity type, a trench having an inner surface being formed in said second main surface of said silicon carbide layer, said trench penetrating said second and third regions;
a gate insulating film covering said inner surface of said trench; and
a gate electrode filling at least a portion of said trench,
wherein said inner surface of said trench has a first side wall inclining with respect to the second main surface and a second side wall located deeper than said first side wall and having a portion made of said second region, and inclining with respect to the second main surface,
wherein said second side wall connects a boundary between said first and second regions with a boundary between said second and third regions,
wherein said second side wall includes {0-33-8} plane or {01-1-4} plane,
wherein a boundary between said first side wall and said second side wall is located at said boundary between said second region and said third region or in said third region, and
wherein an angle of inclination of said first side wall with respect to the second main surface is different than an angle of inclination of said second side wall with respect to the second main surface.

2. The silicon carbide semiconductor device according to claim 1, wherein said gate electrode fills the trench until said gate electrode reaches at least between said first and second side walls.

* * * * *